United States Patent
Yang et al.

(10) Patent No.: US 11,024,680 B2
(45) Date of Patent: Jun. 1, 2021

(54) OLED DISPLAY PANEL AND FABRICATION METHOD OF THE SAME

(71) Applicant: BOE TECHNOLOGY GROUP CO., LTD., Beijing (CN)

(72) Inventors: Ming Yang, Beijing (CN); Minghua Xuan, Beijing (CN); Ning Cong, Beijing (CN); Han Yue, Beijing (CN); Can Zhang, Beijing (CN); Can Wang, Beijing (CN); Xiaochuan Chen, Beijing (CN); Shengji Yang, Beijing (CN); Liang Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/489,789

(22) PCT Filed: Mar. 25, 2019

(86) PCT No.: PCT/CN2019/079561
§ 371 (c)(1),
(2) Date: Aug. 29, 2019

(87) PCT Pub. No.: WO2019/196639
PCT Pub. Date: Oct. 17, 2019

(65) Prior Publication Data
US 2020/0066805 A1   Feb. 27, 2020

(30) Foreign Application Priority Data

Apr. 10, 2018   (CN) .......................... 201810319314.6

(51) Int. Cl.
*G06F 3/044* (2006.01)
*H01L 27/32* (2006.01)
(Continued)

(52) U.S. Cl.
CPC .......... *H01L 27/323* (2013.01); *G06F 3/0412* (2013.01); *H01L 27/3276* (2013.01);
(Continued)

(58) Field of Classification Search
None
See application file for complete search history.

(56) References Cited

U.S. PATENT DOCUMENTS

| 8,900,976 B2 | 12/2014 | Jin et al. |
| 2008/0308792 A1* | 12/2008 | Takahashi ............ G09G 3/3291 257/40 |

(Continued)

FOREIGN PATENT DOCUMENTS

| CN | 101452947 A | 6/2009 |
| CN | 103385035 A | 11/2013 |

(Continued)

OTHER PUBLICATIONS

Office Action on CN 201810319314.6, dated Dec. 26, 2019, 10 pages with English translation.

(Continued)

*Primary Examiner* — Carl Adams
(74) *Attorney, Agent, or Firm* — The Webb Law Firm

(57) ABSTRACT

The present disclosure relates to a display panel and a method of fabricating the same. An organic light emitting diode (OLED) display panel, comprising: a plurality of touch electrodes configured to sense a touch; touch electrode leads electrically connected to the plurality of touch electrodes; and OLED devices each comprising a cathode and a functional layer having a via-hole; wherein, the plurality of touch electrodes function as cathodes of the OLED devices, and are electrically connected to the touch electrode leads through the via-holes.

19 Claims, 10 Drawing Sheets

(51) Int. Cl.
  *G06F 3/041* (2006.01)
  *H01L 51/00* (2006.01)
  *H01L 51/52* (2006.01)
  *H01L 51/56* (2006.01)
(52) U.S. Cl.
  CPC ...... *H01L 51/0011* (2013.01); *H01L 51/5221* (2013.01); *H01L 51/56* (2013.01); *H01L 2227/323* (2013.01)

(56) References Cited

U.S. PATENT DOCUMENTS

2015/0153875 A1* 6/2015 Zhang .................. G06F 3/0412
                                                     345/174
2017/0220150 A1* 8/2017 Wu ..................... H01L 51/5209

FOREIGN PATENT DOCUMENTS

| CN | 107532276 A | 1/2018 |
| CN | 107704129 A | 2/2018 |
| CN | 108389883 A | 8/2018 |
| CN | 108428726 A | 8/2018 |
| JP | 2010-174305 A | 8/2010 |

OTHER PUBLICATIONS

Office Action on CN 201810319314.6, dated May 28, 2019, 16 pages with English translation.

* cited by examiner

OLED DISPLAY PANEL AND FABRICATION METHOD OF THE SAME

CROSS REFERENCE TO RELATED APPLICATIONS

This application is a national stage application of International Application No. PCT/CN2019/079561, filed on Mar. 25, 2019, which claims priority to Chinese Patent Application No. 201810319314.6, filed on Apr. 10, 2018. Both of the aforementioned applications are hereby incorporated by reference in their entireties.

FIELD OF THE INVENTION

The present disclosure relates to the field of display technology.

BACKGROUND

Organic Light Emitting Diode (OLED) displays have developed rapidly in recent years due to their high color gamut, high contrast, ultra-thin thickness, and flexibility.

The existing OLEDs mostly adopt the on-cell touch control technique. With this solution, additional processes are required, and the integration of Touch Display Driver IC (TDDI) cannot be realized. On the contrary, In-cell touch control usually requires no additional process, which makes it easier for the integration of TDDI. Therefore, in-cell touch control has become an important development direction for future OLED products.

SUMMARY

According to an aspect of the present disclosure, a method of fabricating an organic light emitting diode (OLED) display panel is provided, comprising:

providing an array substrate having touch electrode leads;

forming a functional layer of OLEDs such that the functional layer has via-holes; and forming touch electrodes for sensing a touch, such that the touch electrodes are electrically connected to the touch electrode leads through the via-holes, wherein, forming the functional layer of OLEDs such that the functional layer has the via-holes includes:

disposing a shield device above the array substrate, wherein the shield device comprise shield posts, the shield posts includes end portions adjacent to the array substrate;

providing an evaporation source for evaporating an organic material; and evaporating the organic material with the evaporation source to form the functional layer on the array substrate, and to form the via-holes in the functional layer by a shielding effect of the end portions of the shield posts.

In some embodiments according to the present disclosure, the end portions of the shield posts may be in contact with the array substrate.

In some embodiments according to the present disclosure, a distance between the end portions of the shield posts and the array substrate may be greater than a thickness of the functional layer.

In some embodiments according to the present disclosure, a distance h between the end portions of the shield posts and the array substrate may satisfy an equation:

$$h = \frac{H(P-w)}{W-w},$$

wherein, H is a distance from the evaporation source to a plane in which the array substrate is located, W is a distance between two evaporation sources located farthest at opposite sides of a shield post, and w is a diameter of a via-hole, P is a width of the shield post along a direction of a line connecting the two evaporation sources.

In some embodiments according to the present disclosure, evaporating the organic material with the evaporation source may include:

adjusting an angle of a nozzle of the evaporation source such that the nozzle sequentially ejects a vapor of the organic material at a plurality of angles.

In some embodiments according to the present disclosure, a time during which the nozzle ejects the vapor of the organic material at each of the plurality of angles may be controlled such that the functional layer has a uniform thickness.

In some embodiments according to the present disclosure, the touch electrodes may function as cathodes of the OLEDs, and each touch electrode covers the cathodes of a plurality of OLEDs.

In some embodiments according to the present disclosure, the touch electrode leads may be located in the array substrate or on a surface of the array substrate.

In some embodiments according to the present disclosure, the shield device may include a plurality of shield posts having the same height, and the end portions may have the same size.

In some embodiments according to the present disclosure, the shield posts may be made of a metal, a polymer, or an insulating oxide.

In some embodiments according to the present disclosure, the metal may be selected from a group consisting of gold, silver, copper, aluminum, iron, platinum, tin, tungsten, and alloys comprising two or more of them.

In some embodiments according to the present disclosure, the polymer may be a resin or a plastic.

In some embodiments according to the present disclosure, the insulating oxide may be selected from a group consisting of silicon oxide, silicon carbide, and silicon oxynitride.

In another aspect of the present disclosure, there is provided an organic light emitting diode (OLED) display panel, comprising:

a plurality of touch electrodes configured to sense a touch;

touch electrode leads electrically connected to the plurality of touch electrodes; and OLED devices each comprising a cathode and a functional layer having a via-hole;

wherein, the plurality of touch electrodes function as cathodes of the OLED devices, and are electrically connected to the touch electrode leads through the via-holes.

In some embodiments according to the present disclosure, each touch electrode may act as the cathodes of a plurality of OLED devices.

In some embodiments according to the present disclosure, the OLED display panel may further comprise an array substrate, wherein the touch electrode leads are located in the array substrate.

In some embodiments according to the present disclosure, each OLED device may include an anode, and the anodes of the OLED devices are separated from one another.

In some embodiments according to the present disclosure, the touch electrode leads may be in the same layer as the anodes of the OLED devices.

In some embodiments according to the present disclosure, the OLED devices may further comprise a light emitting layer.

In some embodiments according to the present disclosure, the touch electrode may be made of a transparent conductive material, and light emitted by the OLED device is transmitted through the touch electrode.

In a further aspect of the present disclosure, there is provided a method of forming an organic material layer having via-holes, comprising:

providing a substrate;

disposing a shield device above the substrate, wherein the shield device comprises shield posts, and each of the shield posts includes an end portion adjacent to the substrate;

providing an evaporation source for evaporating an organic material; and evaporating the organic material with the evaporation source to form an organic material layer on the substrate and to form via-holes in the organic material layer by a shielding effect of the end portions of the shield posts.

In some embodiments according to the present disclosure, the end portions of the shield posts may be in contact with the substrate.

In some embodiments according to the present disclosure, a distance between the end portions of the shield posts and the substrate may be greater than a thickness of the organic material layer.

In some embodiments according to the present disclosure, the distance h between the end portions of the shield posts and the substrate may satisfy the following equation:

$$h = \frac{H(P-w)}{W-w},$$

wherein, H is a distance from the evaporation source to a plane in which the substrate is located, and W is a distance between two evaporation sources located farthest from opposite sides of the shield post, and w is a diameter of the via-hole, P is a width of the shield post along a direction of a line connecting the two evaporation sources.

In some embodiments according to the present disclosure, evaporating the organic material with the evaporation source may include:

adjusting an angle of a nozzle of the evaporation source such that the nozzle sequentially ejects a vapor of the organic material at a plurality of angles.

In some embodiments according to the present disclosure, the time during which the nozzle ejects the vapor of the organic material at the plurality of angles may be controlled such that the organic material layer has a uniform thickness.

BRIEF DESCRIPTION OF THE DRAWINGS

In order to more clearly explain the embodiments of the present invention or the technical solutions in the prior art, a brief introduction will be given below for the drawings required to be used in the description of the embodiments or the prior art. It is obvious that, the drawings illustrated as follows are merely some of the embodiments of the present disclosure. For a person skilled in the art, he or she may also acquire other drawings according to such drawings on the premise that no inventive effort is involved.

DETAILED DESCRIPTION OF EMBODIMENTS

Below, a clear and complete description will be given for the technical solution of embodiments of the present disclosure with reference to the figures of the embodiments. Obviously, merely some embodiments of the present disclosure, rather than all embodiments thereof, are given herein. All other embodiments obtained by those of ordinary skill in the art based on the embodiments of the present disclosure without creative efforts shall fall within the protection scope of the present disclosure.

At present, the commonly used OLED in-cell touch control technique adopts a cathode division multiplexing scheme: a corresponding number of touch electrodes are formed by dividing a cathode according to a touch resolution, and each touch electrode is connected outside by a touch lead; in a display phase, each of the touch electrodes is loaded with the same cathode voltage, and in a touch phase, the touch electrodes are loaded with touch signals.

Figure 1:
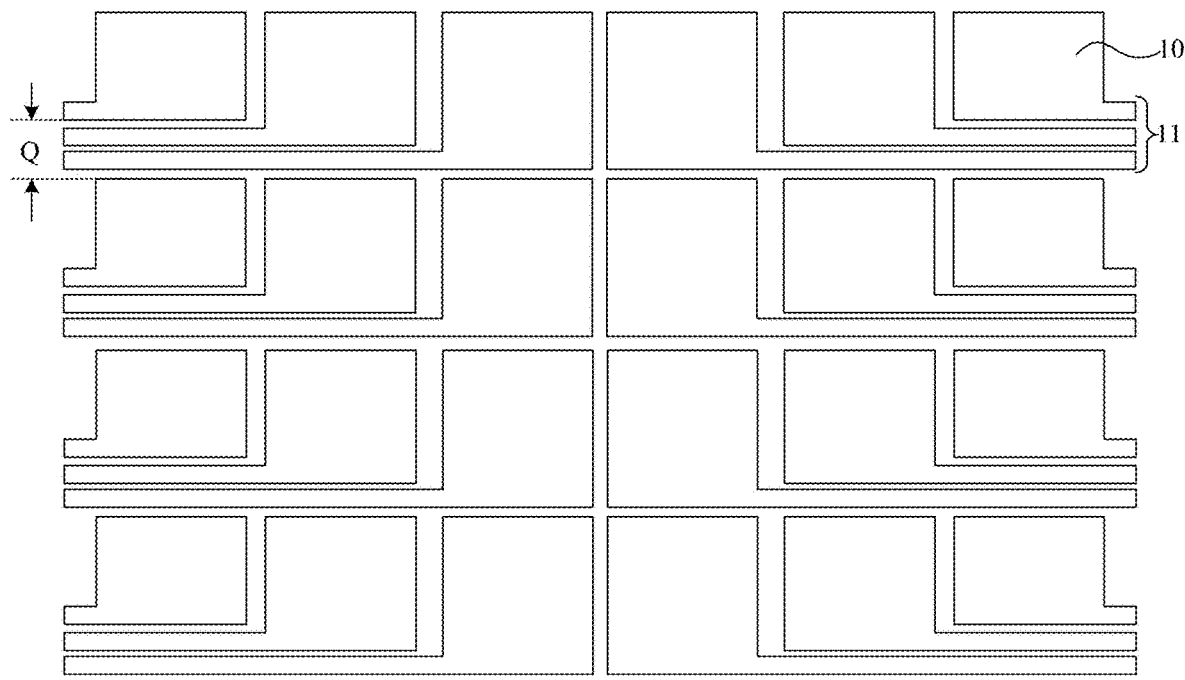
FIG. 1 is a principal diagram of an in-cell touch scheme suitable for a small-sized OLED display.

FIG. 1 is a principal diagram of an in-cell touch scheme suitable for a small-sized OLED display. Touch electrode leads 11 extend from the center of the screen to the left and right sides for all touch electrodes 10 respectively. Take 4×6 touch electrodes 10 as an example, where 4 represents the number of rows and 6 represents the number of columns. It can be found that the touch electrodes 10 includes a plurality of touch electrode leads 11 in a spacing (Q as shown in FIG. 1) in the vertical direction, and the touch electrode lead 11 has a minimum width of a sub-pixel width, which results in a touch blind zone. For a small-sized OLED, the number of touch electrode leads 11 in the touch blind zone is small, so that the proportion of the touch blind zone is small. As the size of the OLED increases, the proportion of the touch blind zone increases, making this in-cell touch scheme no longer applicable.

Figure 2:
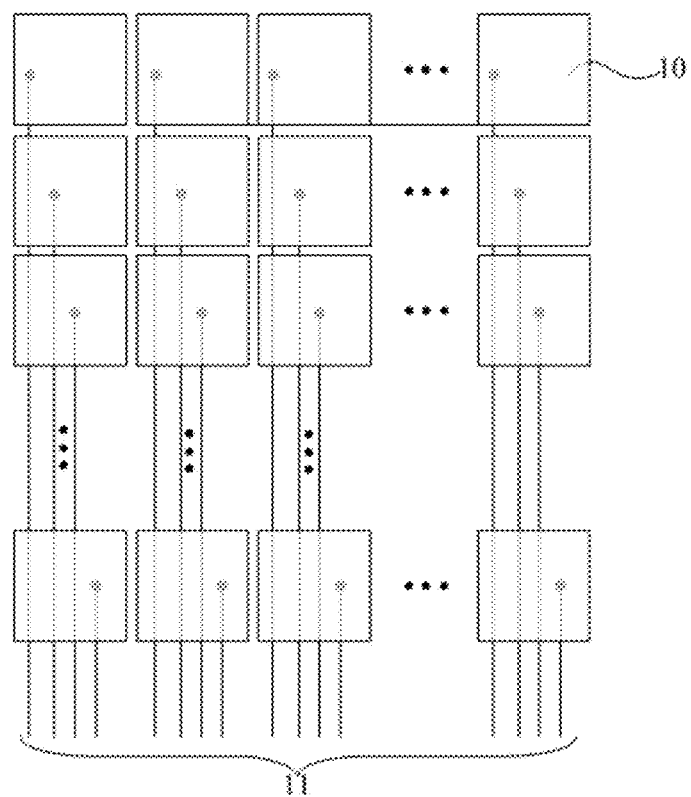
FIG. 2 is a principal diagram of an in-cell touch scheme suitable for small-sized and large-sized OLED displays.

FIG. 2 is a principal diagram of an in-cell touch scheme suitable for small-sized and large-sized OLED displays. M×N touch electrodes 10 (M and N are positive integers) are provided according to the touch resolution, each touch electrode 10 corresponds to a touch electrode lead 11, and the connection point between the touch electrode lead 11 and the touch electrode 10 is a touch conduction point. With the in-cell touch scheme, the spacing between the touch electrodes 10 is small, resulting in a small touch blind zone and better touch effect.

However, in general, the organic functional layer of the OLED device other than the light emitting layer in the OLED display is fabricated by using an open mask, and the organic functional layer in the display region is unpatterned. In the prior art, due to the blockage of the organic functional layer in the display region, the touch electrode 10 acting as the OLED cathode cannot be connected to the touch electrode lead 11 under the organic functional layer, so that signal loading cannot be achieved for the touch electrodes.

Figure 17:
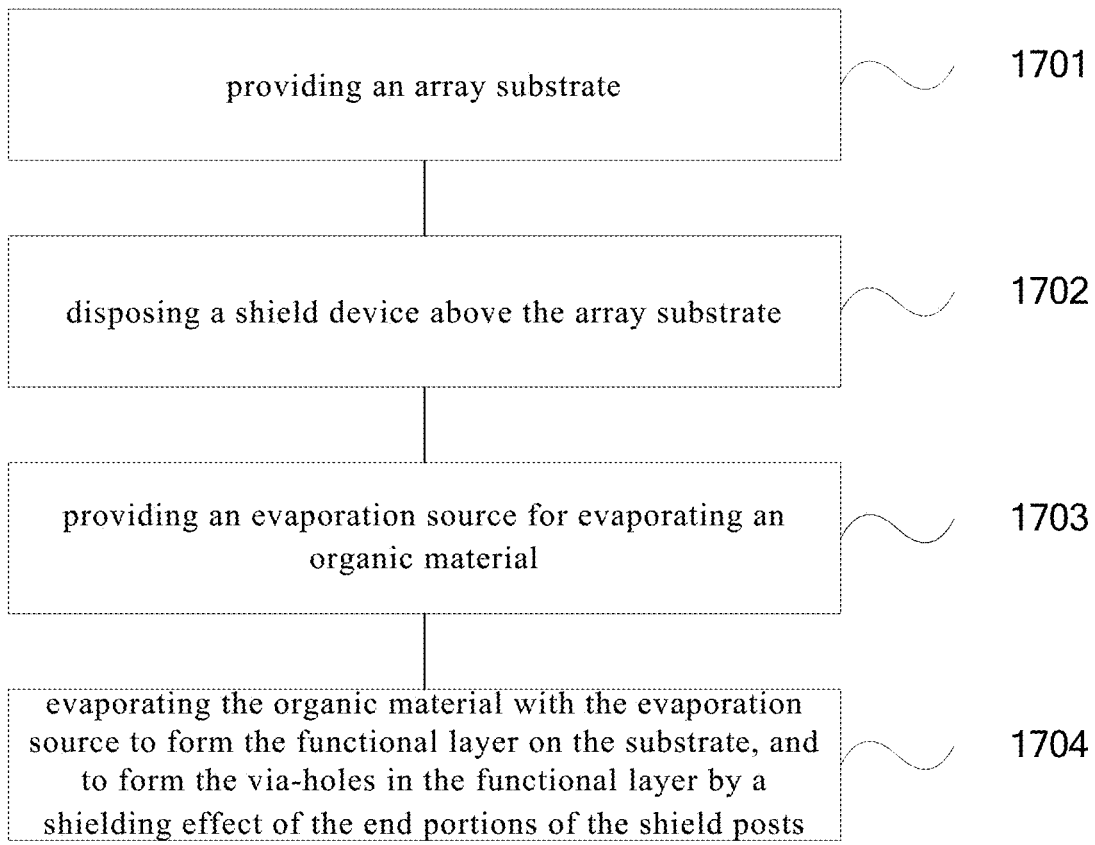
FIG. 17 is a flow chart of a method of forming an organic material layer having a via-hole in accordance with an embodiment of the present disclosure.

FIG. 17 is a flow chart of a method of forming an organic material layer having a via-hole in accordance with an embodiment of the present disclosure.

Figure 7:
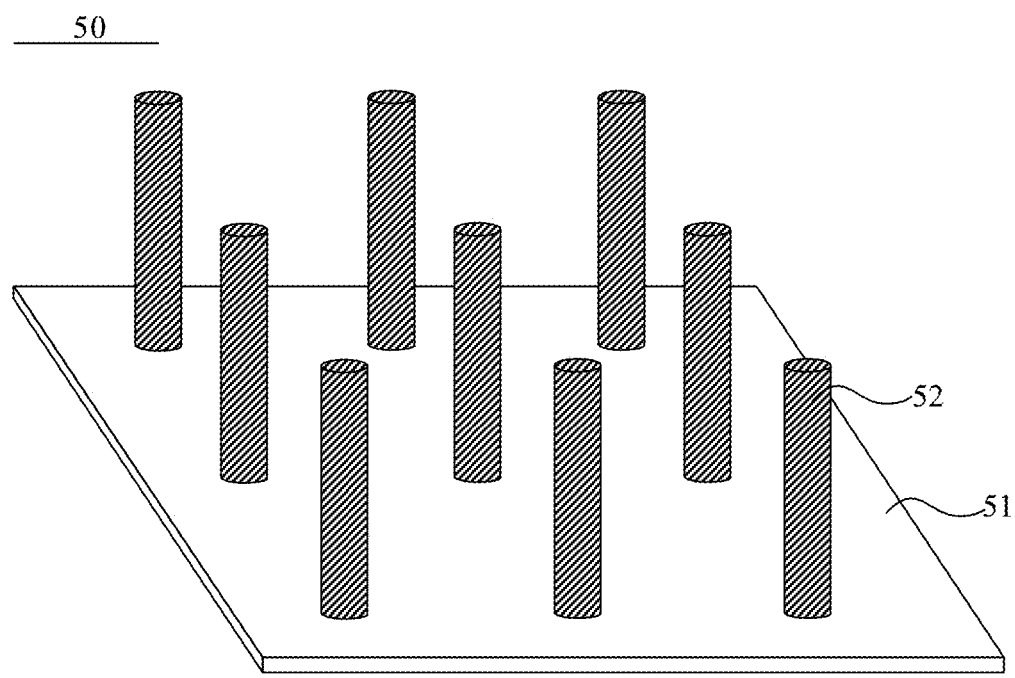
FIG. 7 is a schematic view of an evaporation shield device in accordance with an embodiment of the present disclosure.

As shown in FIG. 7, the method mainly includes the following steps:

providing a substrate (1701);

disposing a shield device above the substrate, the shield device comprising a shield post including an end portion adjacent to the substrate (1702);

providing an evaporation source for evaporating an organic material (1703); and evaporating the organic material with the evaporation source to form an organic material layer on the substrate, and forming a via-hole in the organic material layer by a shielding effect of the end portion of the shield post (1704).

Figure 18:
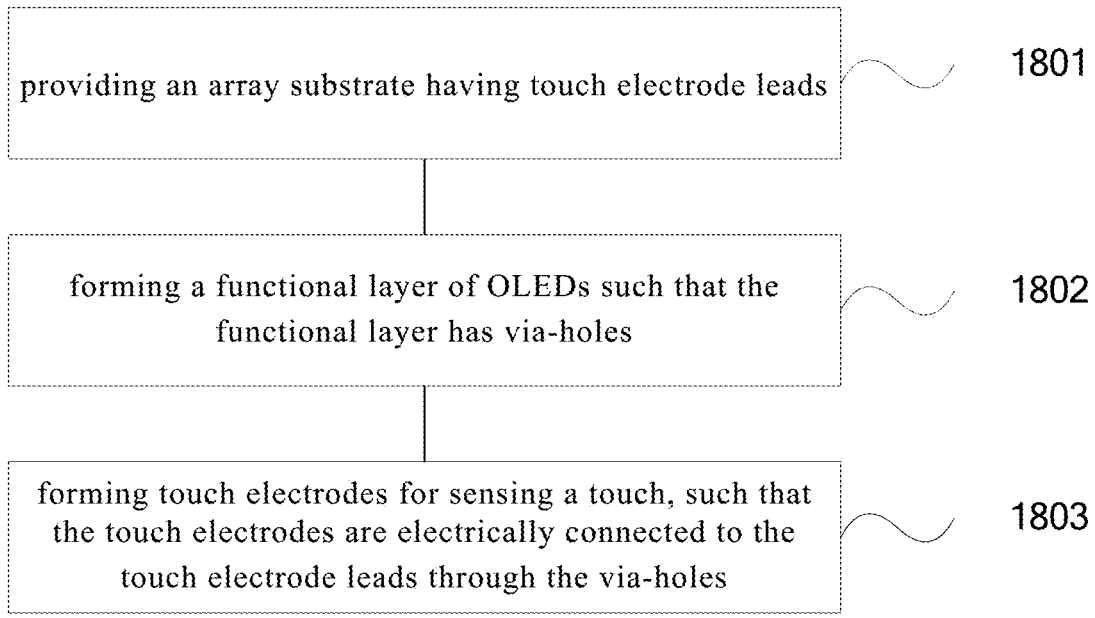
FIG. 18 is a flow chart of a method of fabricating an OLED display panel in accordance with an embodiment of the present disclosure.

FIG. 18 is a flow chart of a method of fabricating an OLED display panel in accordance with an embodiment of the present disclosure.

As shown in FIG. 18, the fabrication method mainly includes the following steps:

providing an array substrate having touch electrode leads (1801);

forming a functional layer of an OLED device such that the functional layer has via-holes therein (1802); and forming touch electrodes for sensing a touch, such that the touch electrodes are electrically connected to the touch electrode leads through the via-holes (1803).

In step 1802, the via-holes can be formed in the functional layer of the OLED using the method shown in FIG. 17.

Figure 3:
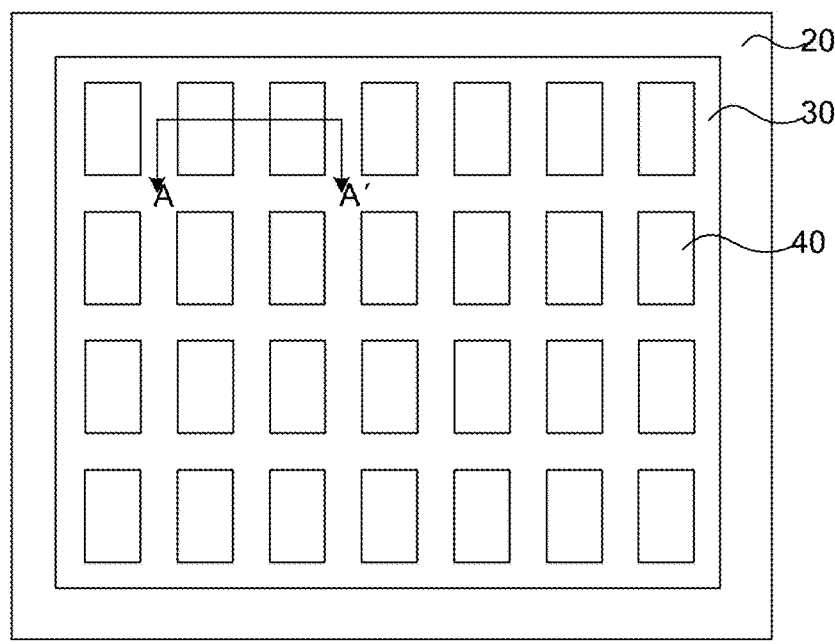
FIG. 3 is a top view of an OLED display panel in accordance with an embodiment of the present disclosure.
Figure 4:
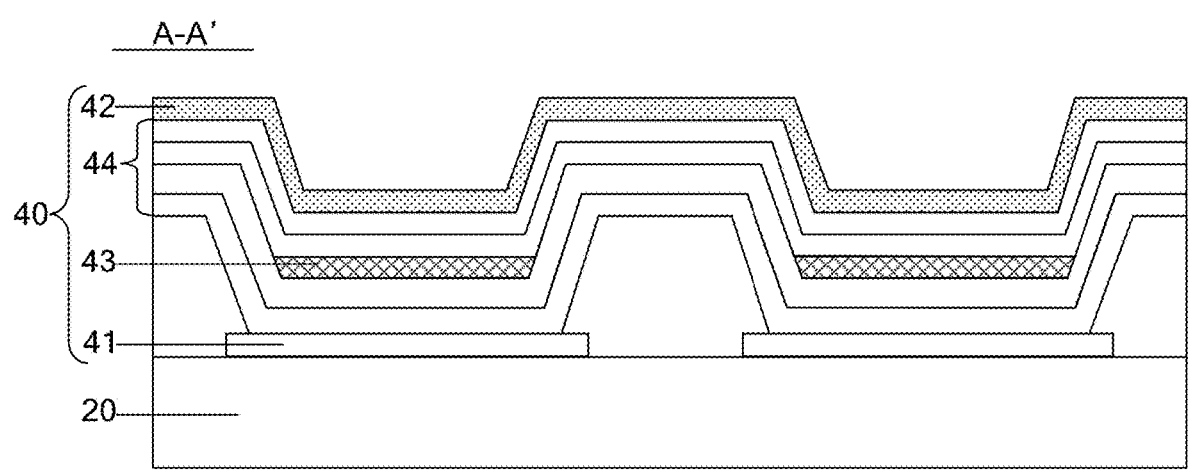
FIG. 4 is a cross-sectional view taken along line A-A' in FIG. 3.
Figure 5:
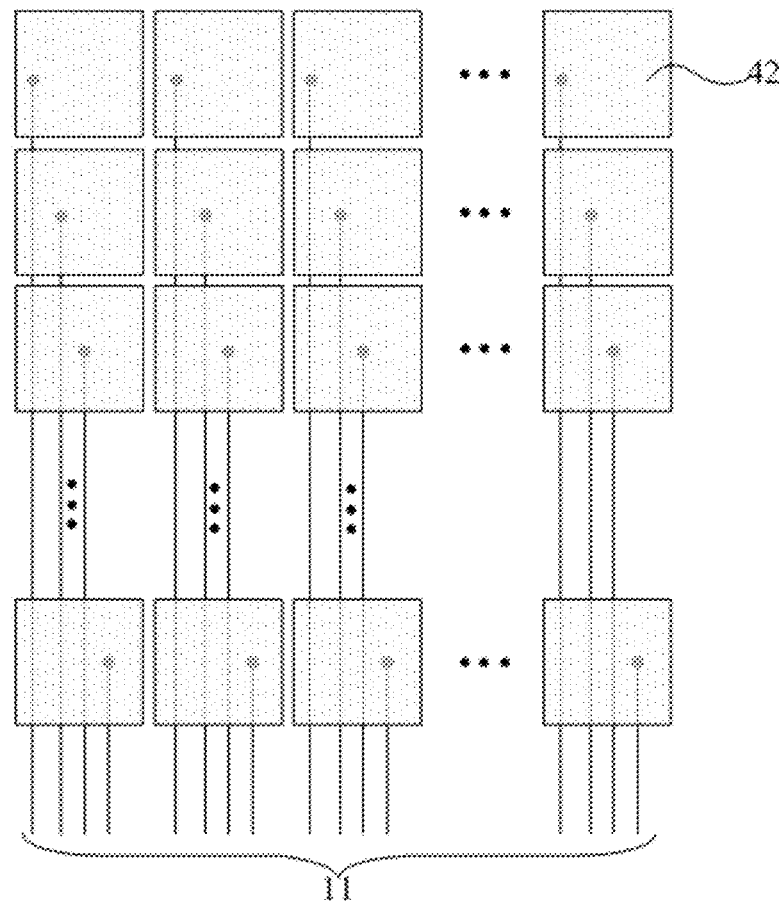
FIG. 5 is a schematic diagram of a cathode arrangement and their electrical connection with touch electrode leads in accordance with an embodiment of the present disclosure.
Figure 6:
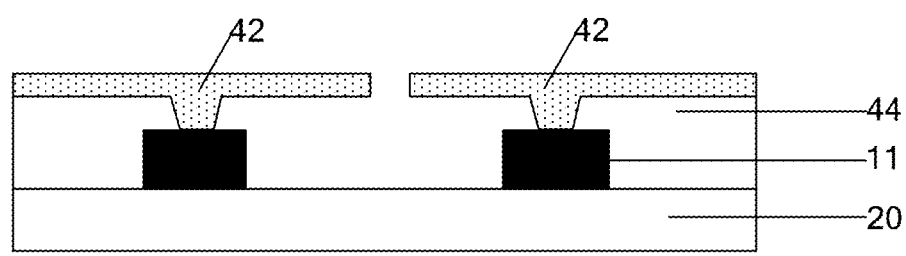
FIG. 6 is a schematic cross-sectional view of the electrical connection of a cathode and a touch electrode lead in accordance with an embodiment of the present disclosure.

A further detailed description will be given below in conjunction with specific embodiments. An embodiment of the present disclosure provides an OLED display panel. As shown in FIG. 3 and FIG. 4, the display panel includes a plurality of OLED devices 40 formed on a display area 30 on a substrate 20. The OLED devices 40 include anodes 41 and cathodes 42, an organic layer located between the anodes 41 and the cathodes 42. The organic layer comprises a light emitting layer 43 and a functional layer 44. As shown in FIG. 5, the cathodes 42 in the display region 30 are arranged in an array. Each of the cathodes 42 can cover a region in which a plurality of OLED devices 40 are located, and the cathodes 42 are insulated from one another. As shown in FIG. 5 and FIG. 6, each cathode 42 is electrically connected to at least one touch electrode lead 11 through a via-hole in the functional layer 44.

The functional layer 44 can be formed by the method shown in FIG. 17. For example, the method of forming the functional layer 44 may include: depositing an organic material evaporated by the evaporation source in the display region 30 with an open mask while shielding with a shield device, such that the organic material is deposited in a region in the display region 30 other than locations where via-holes are to be formed, thereby forming a functional layer 44 including via-holes.

That is, the embodiment of the present disclosure uses the shielding of the shield device to form the via-holes while forming the functional layer 44 by evaporation, without changing the structure of the open mask (a size of which is the same as a size of the display region 30).

It should be noted that, when the functional layer 44 is a structure having two or more layers, the via-holes on each layer of the functional layer 44 are superimposed on one another to ensure that the touch electrode lead 11 can be electrically connected to the cathode 42 through the via-hole in the functional layer 44 between the touch electrode lead 11 and the cathode 42.

Secondly, those skilled in the art can understand that the position of the conduction point of the touch electrode lead 11 and the cathode 42 should avoid the light emitting layer 43 to avoid affecting the luminescence performance of the product. Based on this, it can be understood that the via-holes are only provided in the functional layer 44.

Thirdly, for each cathode 42, in the display phase, a cathode voltage is applied to the cathode 42 through the touch electrode lead 11; in the touch phase, a touch signal is applied to the cathode 42 through the touch electrode lead 11 so that the cathode 42 functions as a touch electrode.

Since the touch scheme of the present disclosure is suitable for a large-sized OLED display panel, it can be understood that the touch electrode lead 11 is drawn out at a conduction point with the cathode 42 and extends in the vertical direction to the edge of the display region 30, as shown in FIG. 5.

Fourthly, there is no limitation on the structure of the shield device, as long as no organic material is deposited at the location of the via-hole during the evaporation process, and the formation of the functional layer 44 is not affected.

An embodiment of the present disclosure provides a method of fabricating an OLED display panel. When an open mask is used for forming, by evaporation, a functional layer 44 located between the touch electrode lead 11 and the cathode 42, a shield device is introduced, by which a via-hole for electrically connecting the touch electrode lead 11 and the cathode 42 is formed while the functional layer 44 is formed by evaporation. Thus, when a touch signal is applied to the cathode 42 through the touch electrode lead 11, the OLED display panel of the present disclosure can achieve a touch function.

Optionally, the functional layer 44 includes at least one of a hole injection layer, a hole transport layer, an electron transport layer, and an electron injection layer. Of course, other organic layers may also be included.

Figure 8:
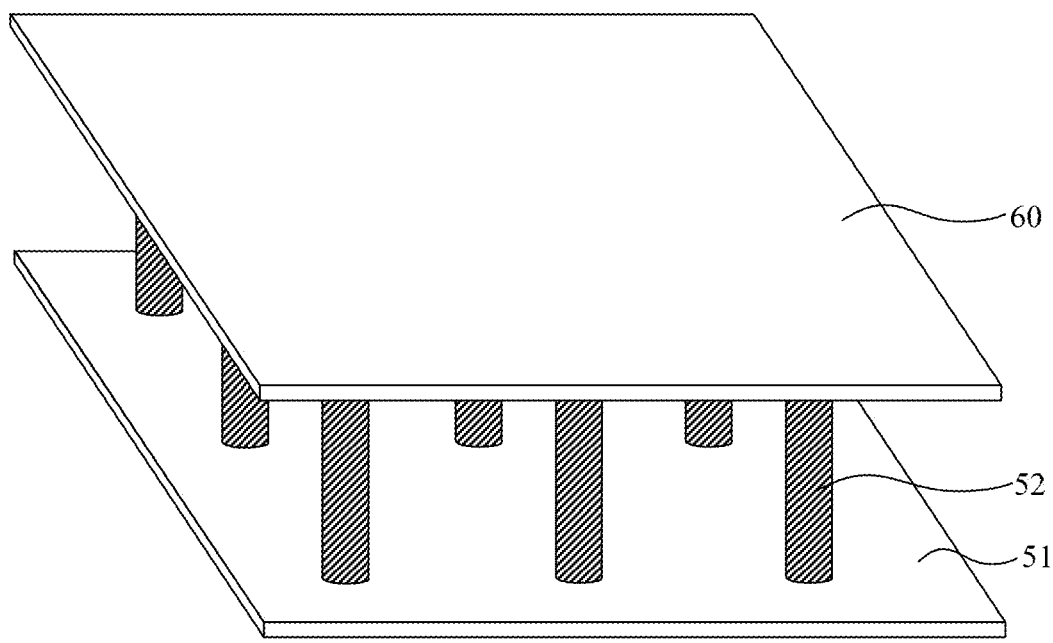
FIG. 8 is a schematic view of an evaporation shield device aligned with an array substrate on which a functional layer is to be formed in accordance with an embodiment of the present disclosure.

Optionally, as shown in FIG. 7, the evaporation shield device 50 includes a plurality of shield posts 52. In some embodiments in accordance with the present disclosure, the number of shield posts 52 is equal to the number of the via-holes in the functional layer 44. On this basis, shielding with the shield device comprises: as shown in FIG. 8, aligning the evaporation shield device 50 with the array substrate 60 on which a functional layer to be formed, so that the end portions of the shield posts 52 are in contact with or close to the array substrate 60 and in one-to-one correspondence with the locations at which via-holes are to be formed.

The shield post 52 may be in a shape of a column, such as a cylinder, a prism, etc. The shield post 52 may be made of, for example, a metal such as gold, silver, copper, aluminum, iron, platinum, tin, tungsten, and an alloy containing two or more of them, etc, a polymer such as a resin or a plastic, etc, or an insulating oxide such as silicon oxide, silicon carbide, silicon oxynitride or the like.

Considering that the touch electrode lead 11 is generally made of a metal material, which may affects the light emitting area of the display region 30 if it is located in the display region 30. Therefore, in order to minimize the influence of the touch electrode lead 11 on the light emitting area of the display region 30, each cathode 42 can be electrically connected to a touch electrode lead 11 through a via-hole in the functional layer 44.

Wherein, the spacing of the shield posts 52 should be set according to the size of the cathode 42. In some embodiments according to the present disclosure, since the cathode 42 also functions as a touch electrode, the length and width of the cathode 42 may be selected to be, for example, about 4 mm to 6 mm, and the spacing between the shield posts 52 may be correspondingly set to, for example, 4 mm to 6 mm.

Further, as shown in FIG. 7, the shield device may further include a carrier plate 51 on which shield posts 52 are fixed. On this basis, as shown in FIG. 9, the carrier plate 51 may be located on a side of the evaporation source 70 away from the array substrate 60 on which a functional layer to be formed, and the evaporation source 70 is located outside the periphery of the carrier plate 51.

Figure 10:
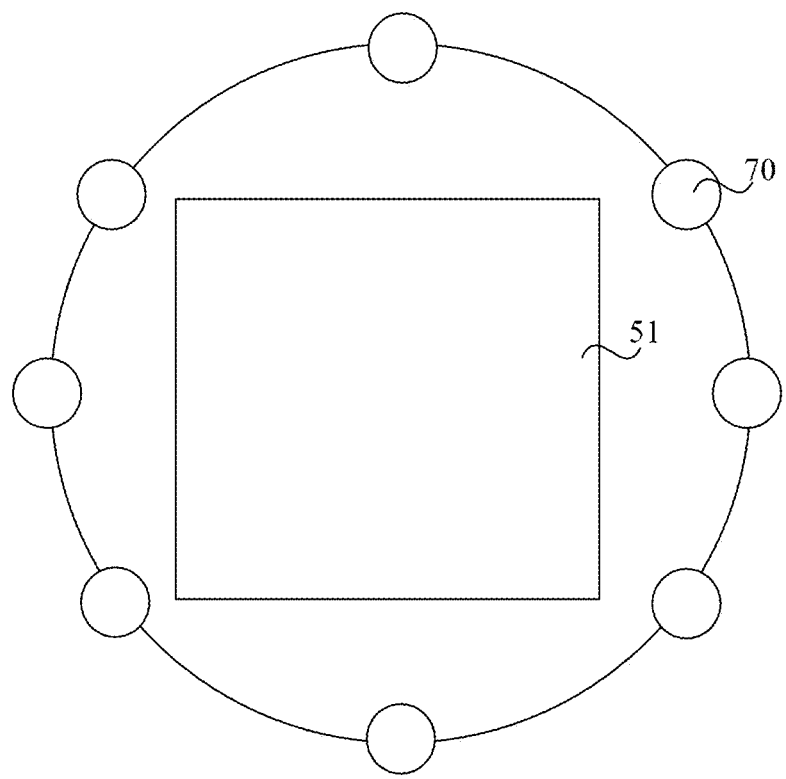
FIG. 10 is a schematic view of the arrangement of a plurality of evaporation sources according to an embodiment of the present disclosure.

There may be a plurality of evaporation sources 70. In some embodiments in accordance with the present disclosure, the plurality of evaporation sources 70 may be in the same plane. As shown in FIG. 10, the plurality of evaporation sources 70 may be disposed in a ring, for example, and the specific number of the evaporation sources 70 is determined to ensure film thickness uniformity.

Figure 9:
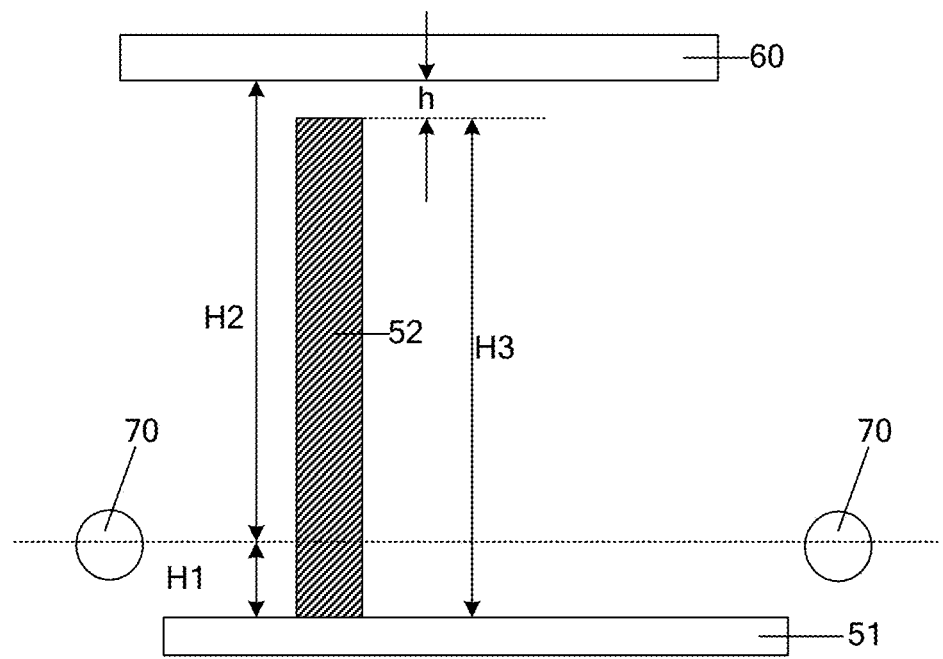
FIG. 9 is a schematic view of a relative position of an evaporation shield device and an evaporation source according to an embodiment of the present disclosure.

As shown in FIG. 9, a distance between the carrier plate 51 and a plane where the evaporation sources 70 are located can be set to H1, a distance between the evaporation source 70 and a plane where the substrate 60 on which a via-hole is to be formed is located can be set to H2, and the height of the shield post 52 is H3=H1+H2-$h$.

It should be noted that the presence of the shield post 52 has little influence on the uniformity of film thickness. Specifically, taking a 5-inch mobile phone as an example, provided that the length and width of each cathode 42 are both 5 mm, and the number of conduction points on each OLED substrate (i.e., the number of via-holes for electrically connecting the touch electrode leads 11 and the cathodes 42) is usually 12×20=240, the total area of the conduction points is 240×10 μm×10 μm=2.4×10$^{-2}$ mm$^2$, and the area of the 5-inch mobile phone is 62 mm×110 mm=6820 mm$^2$, and the ratio of the area of the conduction points to the total area is 2.4×10$^{-2}$ mm$^2$/6820 mm$^2$=3.52×10$^{-6}$. It can be found that the proportion of the conduction points is about one millionth, which is extremely small. It can be seen that the shielding effect of the shield posts 52 on the vapor deposition gas is small, that is, the presence of the shield posts 52 has little influence on the uniformity of film thickness.

In the embodiment of the present disclosure, the carrier plate 51 is disposed on a side of the evaporation source 7 away from the array substrate 60 on which a functional layer is to be formed, thereby preventing the carrier plate 51 from shielding the evaporated gas. The evaporation sources 70 are disposed outside the peripheral of the carrier plate 51, so that the provision of the evaporation sources 70 is not affected by the spacing of the shield posts 52.

Optionally, there is a gap between the shield post 52 and the substrate 60 on which a functional layer is to be formed. Of course, in the embodiment of the present disclosure, the shield post 52 can also be in contact with the substrate 60. With a gap provided between the shield post 52 and the substrate 60, it is possible to avoid the destruction of the organic functional layer or the generation of particles when the shield post 52 is removed.

In the case where there is a gap between the shield post 52 and the substrate 60, provided that the distance between the shield post 52 and the substrate 60 is h, in addition to ensuring that the generated functional layer is not contacted (for example, h is larger than the thickness of the functional layer), the presence of h must also ensure that there is no functional layer deposited at the location of the via-hole. The distance h is calculated as follows.

Figure 11:
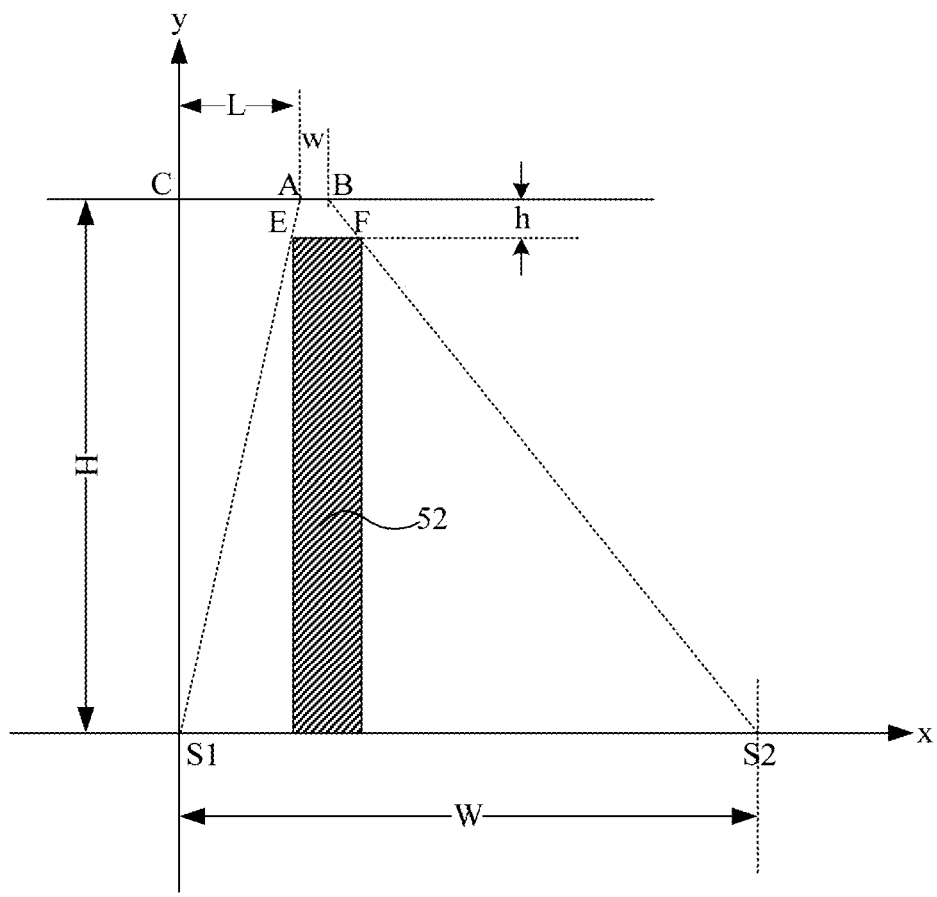
FIG. 11 is a schematic view of the calculation of the position of a shield post relative to an array substrate on which a functional layer is to be formed according to an embodiment of the present disclosure.

As shown in FIG. 11, S1 and S2 are evaporation sources, wherein S1 is an evaporation source 70 at a maximum distance from a side (for example, the left side) of the shield post 52, and S2 is an evaporation source 70 at a maximum distance from another side (for example, the right side) of the shield post 52. The distance between S1 and S2 is W; AB is the via-hole to be formed. In order to ensure effective conduction between the touch electrode lead 11 and the cathode 42, AB has a minimum diameter of w; AC is a distance from the via-hole to S1 in the horizontal direction, and the value of AC is L; S1C is a distance in the vertical direction from the plane where the evaporation source 70 is located to the substrate 60, and has a value of H.

A coordinate system is established with a line where S1S2 are located as x-axis, and a line passing through the point S1 and perpendicular to the x-axis as y-axis. The coordinates of point A are (L, H), the coordinates of point B are (L+w, H), and the coordinates of point S2 are (W, 0).

According to the slope formula, the following equations are available:

$$y = \frac{H \times x}{L} \quad (1)$$

$$y = \frac{H \times x}{L + w - W} - \frac{H \times W}{L + w - W} \quad (2)$$

In order to ensure the feasibility of fabricating the shield post 52, a minimum width (shown as EF in the figure) of the shield post 52 along the line (i.e., the x-axis) where S1S2 are located (in the direction of the line connecting the two evaporation sources) must be ensured, which is set to P.

Provided that the coordinates of point E are (L1, H−h), and the coordinates of point F are (L1+P, H−h), it may be determined that $$H - h = \frac{H \times L1}{L}$$

according to equation (1) and $$H - h = \frac{H(L1 + P)}{L + w - W} - \frac{H \times W}{L + w - W}$$

according to equation (2). On this basis, it can be derived that $$h = \frac{H(P - w)}{W - w}, L1 = \frac{L(W - P)}{W - w}.$$

Wherein, the placement location of the shield post 52 can be determined based on h and L1.

Figure 12:
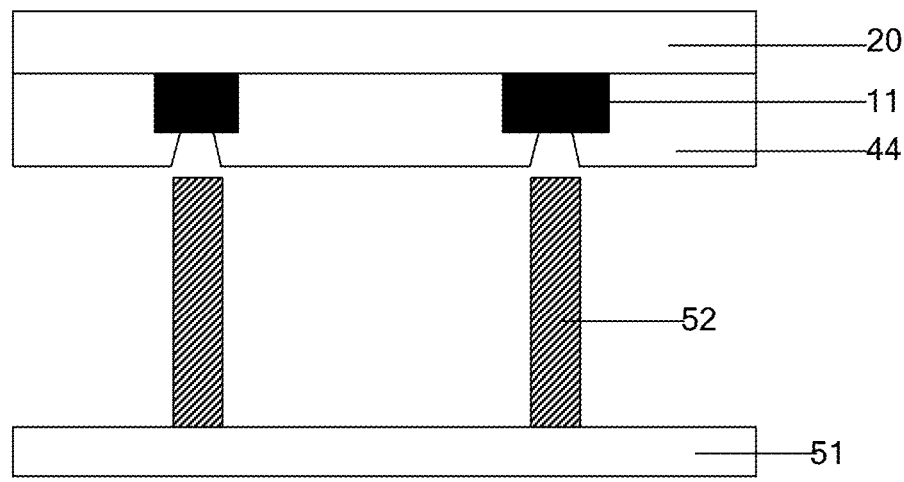
FIG. 12 is a schematic view of forming a functional layer by the shielding of a shield post in accordance with an embodiment of the present disclosure.

With a reasonable design of H, P, W, and w, the via-hole can be formed correctly. As shown in FIG. 12, due to the shielding effect of the shield post 52, the material of the functional layer cannot be deposited at the location where the via-hole is to be formed.

By way of example, assuming that P=100 μm, w=10 μm, H=800 mm, W=600 mm, it may be calculated that $$h = \frac{H(P - w)}{W - w} = 120 \, \mu m = 0.12 \, mm.$$

It should be noted that if the positions of the evaporation sources 70 are fixed, the position where the evaporated gas can reach may be determined. To ensure the effective formation of the via-hole, S2 has a maximum distance from S1 on the left side if the position of S1 is fixed. In this case, due to the shielding effect of the shield post 52, the evaporated gas generated by S1 can reach point A on the array substrate 60, and the evaporated gas generated by S2 can reach point B on the array substrate 60. However, if the distance between S2 and S1 exceeds the maximum distance, the evaporated gas generated by S2 can reach the point A across the shield post 52. In this case, the via-hole cannot be formed. Therefore, the positions of the evaporation sources 70 must be considered in the design the shield post 52.

In addition, according to $$h = \frac{H(P - w)}{W - w},$$

it can be derived that $$P = W + \frac{h(W - w)}{H}.$$

Figure 13:
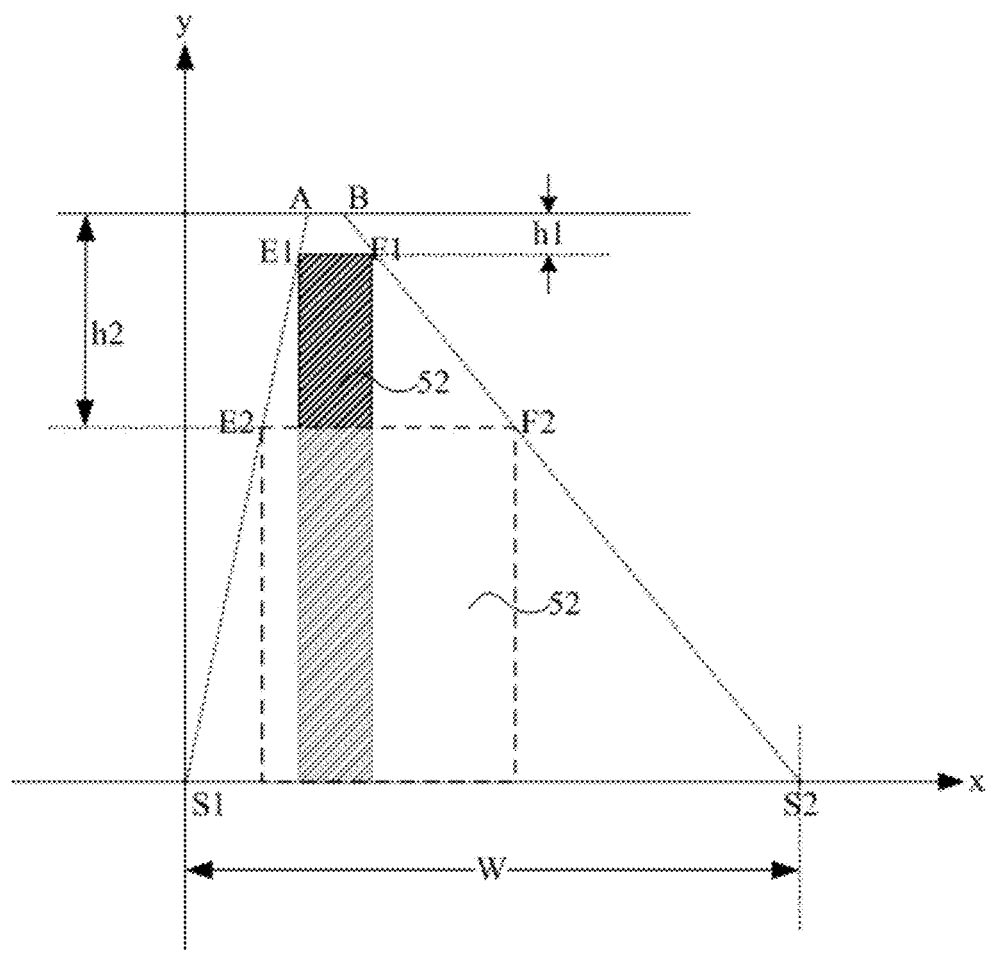
FIG. 13 is a schematic view showing the resizing of a shield post according to an embodiment of the present disclosure.

It can be seen that P can be adjusted by adjusting h; wherein, when h is increased, P is increased accordingly. As shown in FIG. 13, when the distance between the shield post 52 and the substrate 60 is changed from h1 to h2, the size of the shield post is changed from P1 to P2. That is, the size of the shield post 52 is increased. This variation may ensure the flexibility of fabricating the shield post 52, making the fabrication of the shield post 52 flexible.

Optionally, all the shield posts 52 have the same height, and their top end portions adjacent to the substrate 60 have the same size.

Figure 14:
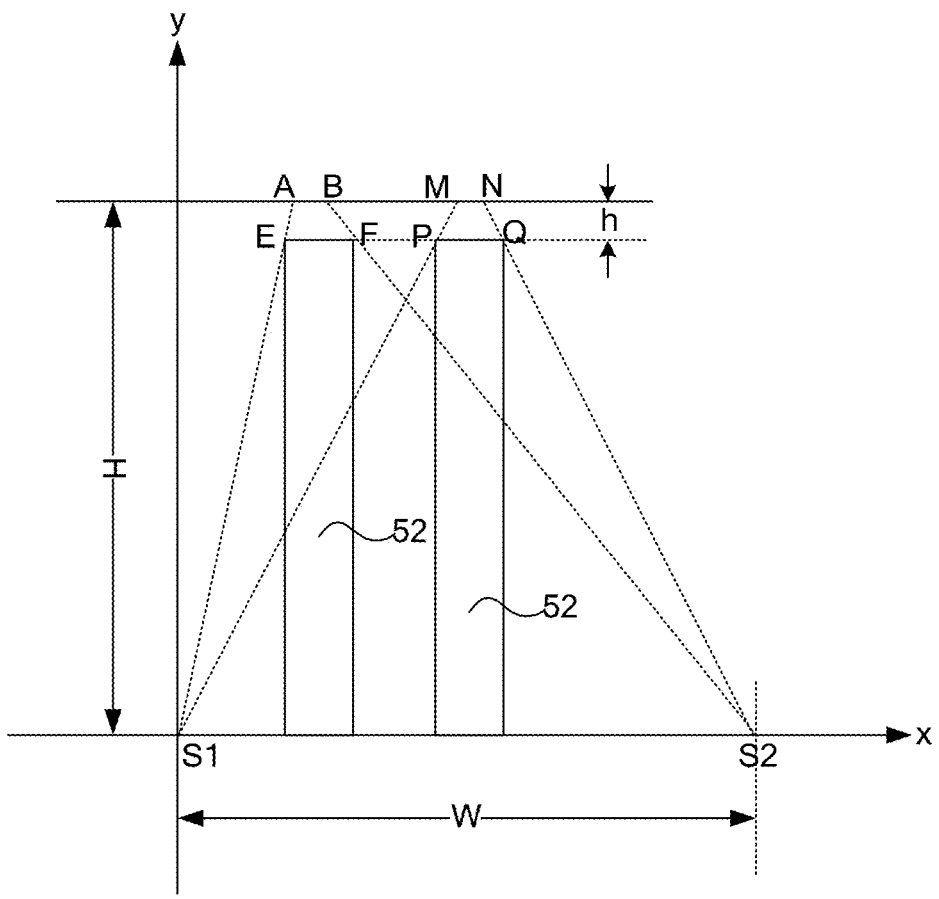
FIG. 14 is a schematic view of the calculation of the size of the shield post and the via-hole according to an embodiment of the present disclosure.

As shown in FIG. 14, according to the geometric relationship, the following equations are available:

$$\frac{EF + FP}{AM} = \frac{H - h}{H}; \quad \text{Equation 3}$$

$$\frac{PQ + FP}{BN} = \frac{H - h}{H}. \quad \text{Equation 4}$$

If the top end portions of the shield posts 52 adjacent to the substrate 60 have the same size, that is, if EF=PQ, AM=BN, that is, AB=MN. It can be seen that if the shield posts 52 have the same height and the same top end portion size, the via-holes have the same size, which can reduce the difficulty in the fabrication of the shield posts 52.

Alternatively, when the functional layer 44 is formed, an angle of the nozzle of the evaporation source 70 is adjusted such that the nozzle sequentially ejects a vapor of the organic material at a plurality of angles. Further, it is also possible to further control the evaporation time of the nozzle at each angle (i.e., the time for ejecting the vapor of the organic material) to make the film thickness of the functional layer 44 uniform.

Figure 15:
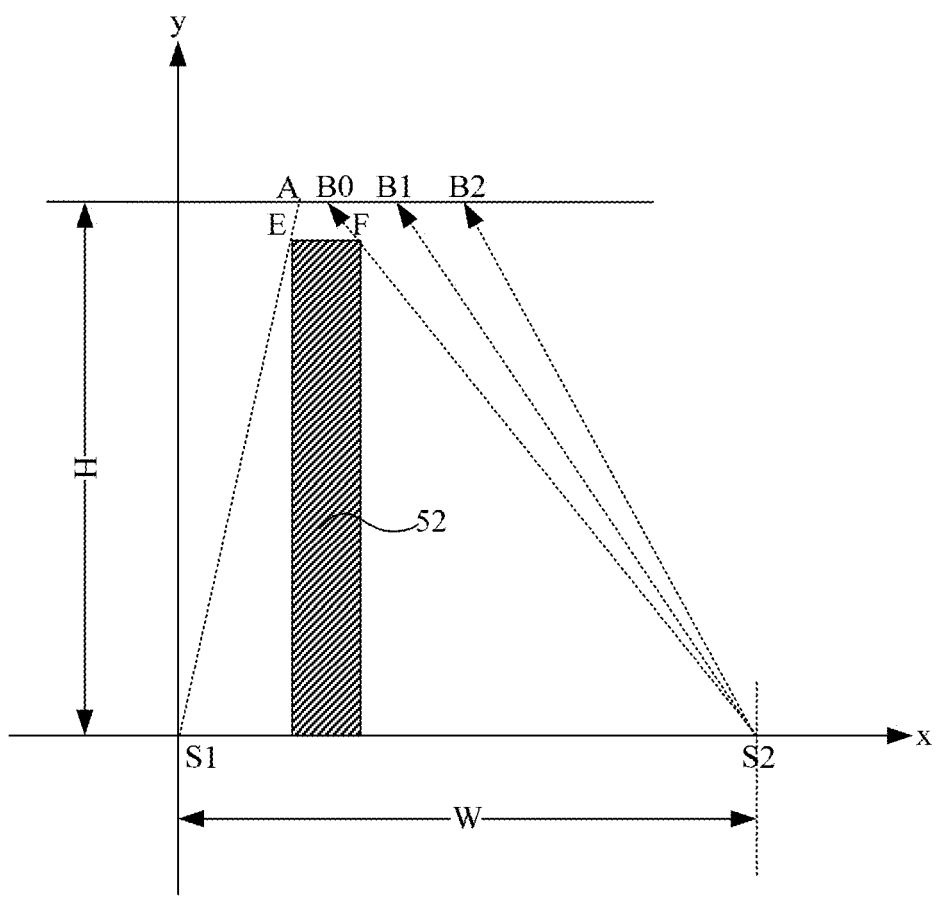
FIG. 15 is a schematic view of a nozzle angle adjustment process of an evaporation source according to an embodiment of the present disclosure.

As shown in FIG. 15, S1 and S2 are evaporation sources 70. For example, at an initial time, S2 may perform evaporation sequentially in the direction S2B0 for time t1, then in the direction S2B1 for time t2, and then in the direction S2B2 for time t3, and so on. Film thickness uniformity can be ensured by adjusting the angle of the nozzle and controlling the time of evaporation.

Alternatively, in order not to increase the number of patterning processes, the touch electrode lead 11 and a metal layer formed between the substrate 20 and the functional layer 44 can be formed simultaneously. On this basis, in the case of a top-emitting OLED substrate, since the anode 41 includes a metal layer, the touch electrode lead 11 and the metal layer can be formed at the same time, that is, the touch electrode lead 11 is disposed in the same layer as the metal layer.

Figure 16:
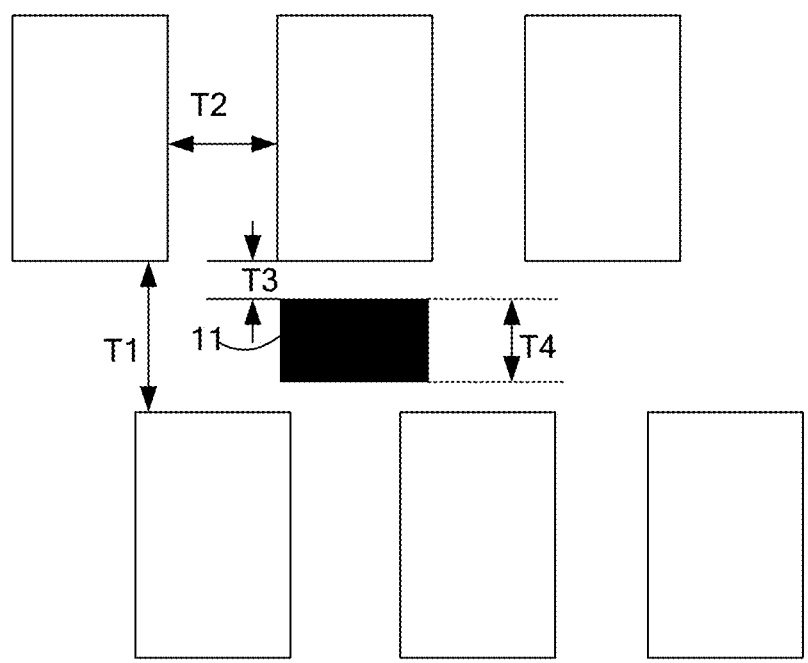
FIG. 16 is a schematic diagram of a sub-pixel arrangement and a touch electrode lead at a conduction point of the touch electrode lead and a cathode in an OLED display panel according to an embodiment of the present disclosure.

In an OLED substrate adopting the sub-pixel arrangement shown in FIG. 16, the distance between adjacent sub-pixels is T1=T2. When the touch electrode lead 11 and the metal layer of the anode 41 are formed simultaneously, it is required to maintain a certain distance T3 from the metal layer of the anode 41. Then, T4=T1-2T3, and T4 is a length of the touch electrode lead in the vertical direction at the conduction point of the touch electrode lead 11 and the cathode 42.

For example, T1 is in a range of 15 μm-20 μm, T3=5 μm; T4=T1-2T3, and has a range of 5 μm-10 μm. In order to ensure conductivity, in this example, T4=10 μm.

An embodiment of the present disclosure further provides an OLED substrate which is fabricated in the above fabrication method. The OLED substrate is suitable for large-sized OLED displays.

The disclosed above are only several specific embodiments of the present disclosure, however, the present disclosure is not limited to this. Any variation or replacement easily conceivable by those skilled in the art within the technical scope disclosed in the present disclosure shall fall within the protection scope of the present disclosure. Therefore, the protection scope of the present disclosure shall be determined by the terms of the claims.

What is claimed is:

1. A method of fabricating an organic light emitting diode (OLED) display panel, comprising:
   providing an array substrate having touch electrode leads;
   forming a functional layer of OLEDs such that the functional layer has via-holes only provided in the functional layer; and
   forming touch electrodes for sensing a touch, such that the touch electrodes are electrically connected to the touch electrode leads through the via-holes,
   wherein forming the functional layer of OLEDs such that the functional layer has the via-holes includes:
   disposing a shield device above the array substrate, wherein the shield device comprise shield posts, the shield posts includes end portions adjacent to the array substrate;
   providing an evaporation source for evaporating an organic material; and
   evaporating the organic material with the evaporation source to form the functional layer on the array substrate, and to form the via-holes in the functional layer by a shielding effect of the end portions of the shield posts.

2. The method according to claim 1, wherein the end portions of the shield posts are in contact with the array substrate.

3. The method according to claim 1, wherein a distance between the end portions of the shield posts and the array substrate is greater than a thickness of the functional layer.

4. The method according to claim 3, wherein a distance h between the end portions of the shield posts and the array substrate satisfies an equation:

$$h = \frac{H(P-w)}{W-w},$$

wherein H is a distance from the evaporation source to a plane in which the array substrate is located, W is a distance between two evaporation sources located farthest at opposite sides of a shield post, and w is a diameter of a via-hole, P is a width of the shield post along a direction of a line connecting the two evaporation sources.

5. The method according to claim 1, wherein evaporating the organic material with the evaporation source includes:
   adjusting an angle of a nozzle of the evaporation source such that the nozzle sequentially ejects a vapor of the organic material at a plurality of angles.

6. The method according to claim 5, wherein a time during which the nozzle ejects the vapor of the organic material at each of the plurality of angles is controlled such that the functional layer has a uniform thickness.

7. The method according to claim 1, wherein the touch electrodes function as cathodes of the OLEDs, and each touch electrode covers the cathodes of a plurality of OLEDs.

8. The method according to claim 1, wherein the touch electrode leads are located in the array substrate or on a surface of the array substrate.

9. The method according to claim 1, wherein the shield device includes a plurality of shield posts having the same height, and the end portions have the same size.

10. The method according to claim 1, wherein the shield posts are made of a metal, a polymer, or an insulating oxide.

11. The method according to claim 10, wherein the metal is selected from a group consisting of gold, silver, copper, aluminum, iron, platinum, tin, tungsten, and alloys comprising two or more of them.

12. The method according to claim 10, wherein the polymer is a resin or a plastic.

13. The method according to claim 10, wherein the insulating oxide is selected from a group consisting of silicon oxide, silicon carbide, and silicon oxynitride.

14. An organic light emitting diode (OLED) display panel, comprising:
   a plurality of touch electrodes configured to sense a touch;
   touch electrode leads electrically connected to the plurality of touch electrodes; and
   OLED devices each comprising a cathode, a light emitting layer, and a functional layer having a via-hole only provided in the functional layer;
   wherein the plurality of touch electrodes function as cathodes of the OLED devices, and are electrically connected to the touch electrode leads through the via-hole.

15. The OLED display panel according to claim 14, wherein each touch electrode acts as the cathodes of a plurality of OLED devices.

16. The OLED display panel according to claim 14, further comprising an array substrate, wherein the touch electrode leads are located in the array substrate.

17. The OLED display panel according to claim 14, wherein each OLED device includes an anode, and the anodes of the OLED devices are separated from one another.

18. The OLED display panel according to claim 17, wherein the touch electrode leads are in the same layer as the anodes of the OLED devices.

19. A method of forming an organic material layer having via-holes, comprising:
   providing a substrate;
   disposing a shield device above the substrate, wherein the shield device comprises shield posts, and each of the shield posts includes an end portion adjacent to the substrate;
   providing an evaporation source for evaporating an organic material; and
   evaporating the organic material with the evaporation source to form an organic material layer on the substrate and to form via-holes in the organic material layer by a shielding effect of the end portions of the shield posts,
   wherein a distance between the end portions of the shield posts and the substrate is greater than a thickness of the organic material layer,
   wherein the distance b between the end portions of the shield posts and the substrate satisfies the following equation:

$$h = \frac{H(P-w)}{W-w},$$

and wherein, H is a distance from the evaporation source to a plane in which the substrate is located, and W is a distance between two evaporation sources located farthest from opposite sides of the shield post, and w is a diameter of the via-hole, and P is a width of the shield post along a direction of a line connecting the two evaporation sources.

\* \* \* \* \*

UNITED STATES PATENT AND TRADEMARK OFFICE
CERTIFICATE OF CORRECTION

Page 1 of 1

PATENT NO. : 11,024,680 B2
APPLICATION NO. : 16/489789
DATED : June 1, 2021
INVENTOR(S) : Ming Yang et al.

It is certified that error appears in the above-identified patent and that said Letters Patent is hereby corrected as shown below:

On the Title Page

Item [57], Line 7, delete "wherein," and insert -- wherein --

In the Claims

Column 12, Line 55, Claim 19, delete "b" and insert -- h --

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*